(12) United States Patent
Gaynor

(10) Patent No.: US 8,866,241 B2
(45) Date of Patent: Oct. 21, 2014

(54) PRESSURE SENSING DEVICE HAVING CONTACTS OPPOSITE A MEMBRANE

(71) Applicant: Silicon Microstructures, Inc., Milpitas, CA (US)

(72) Inventor: Justin Gaynor, Mountain View, CA (US)

(73) Assignee: Silicon Microstructures, Inc., Milpitas, CA (US)

( * ) Notice: Subject to any disclaimer, the term of this patent is extended or adjusted under 35 U.S.C. 154(b) by 0 days.

(21) Appl. No.: 13/674,883

(22) Filed: Nov. 12, 2012

(65) Prior Publication Data

US 2014/0131821 A1    May 15, 2014

(51) Int. Cl.
*H01L 29/84* (2006.01)
*B81B 7/00* (2006.01)
*B81C 1/00* (2006.01)

(52) U.S. Cl.
CPC ..... *B81C 1/00158* (2013.01); *B81B 2201/0264* (2013.01); *B81B 7/0006* (2013.01)
USPC ........... 257/419; 257/415; 257/416; 257/417; 257/418

(58) Field of Classification Search
CPC ............................................... B81B 2201/0264
USPC .................................................. 257/415–419
See application file for complete search history.

(56) References Cited

U.S. PATENT DOCUMENTS 8,558,327 B2 * 10/2013 Knese et al. .................. 257/415

* cited by examiner

*Primary Examiner* — Tran Tran
(74) *Attorney, Agent, or Firm* — Kilpatrick Townsend & Stockton LLP

(57) ABSTRACT

Pressure sensors that may be used in harsh or corrosive environments. One example may provide a pressure sensor having membrane with a top surface that may be free of components or electrical connections. Instead, components and electrical connections may be located under the membrane. By providing a top surface free of components and electrical connections, the top surface of the pressure sensor may be placed in harsh or corrosive environments, while components and electrical connections under the membrane may remain protected.

23 Claims, 9 Drawing Sheets

PRESSURE SENSING DEVICE HAVING CONTACTS OPPOSITE A MEMBRANE

BACKGROUND

Pressure sensors have become ubiquitous the past few years as they have found their way into several new types of products. Utilized in automotive, industrial, consumer, and medical products, the demand for pressure sensors has skyrocketed and shows no signs of abating.

Pressure sensors typically include a diaphragm or membrane. When a pressure sensor experiences a pressure, the membrane responds by changing shape. This change in shape causes one or more characteristics of electronic components on the membrane to change. These changing characteristics can be measured, and from this the pressure can be determined.

Often, the electronic components are resistors that are configured as a Wheatstone bridge located on the membrane. As the membrane distorts due to a pressure, the resistance of the resistors change. This change results in an output of the Wheatstone bridge. This change can be measured using wires or leads attached to the resistors.

These pressure sensors may be used to measure the pressures of fluids and gasses that are fairly benign. For example, these pressure sensors may be used to measure air pressure in a tire or similar environment. In such situations, the resistors and leads may be placed in the fluid to be measured without, or with only minimal, protection.

However, often these pressure sensors may be used in a more harsh or corrosive environment. For example, pressure sensors may be used to measure pressures of blood, gasoline, and other harsh or corrosive substances.

Exposure to such environments may corrode or degrade the leads and resistors of the pressure sensors. This exposure may lead to inaccurate or inconsistent pressure readings, and it may eventually lead to a failure of the device.

Additionally, forming electrical connections in close proximity to the sensitive membrane could produce a change in shape in the membrane, leading to a change in the output that is both undesirable and unpredictable.

Moreover, as device dimensions continue to shrink, it may become increasingly difficult to create electrical connections in close proximity to the sensitive membrane without incurring any damage to the membrane.

Thus, what are needed are circuits, methods, and apparatus that provide pressure sensors that may be used in harsh or corrosive environments, reduce damage to the membrane due to forming electrical connections and reduce permanent stress on the membrane caused by connections made in close proximity to the membranes.

SUMMARY

Accordingly, embodiments of the present invention may provide pressure sensors that may be used in harsh or corrosive environments. Embodiments of the present invention may also provide pressure sensors where damage and stress applied to the membrane during formation of electrical connections are reduced. An exemplary embodiment of the present invention may provide a pressure sensor having membrane with a top surface that may be free of components or electrical connections. Instead, components and electrical connections may be located under the membrane. By providing a top surface free of components and electrical connections, the top surface of the pressure sensor may be placed in harsh or corrosive environments, while components and electrical connections under the membrane may remain protected.

An illustrative embodiment of the present invention may provide a pressure sensor including a device semiconductor layer, the device semiconductor layer having a top side, the top side including a membrane or diaphragm. A cavity defined by the bottom of the membrane and a sidewall may be located below the membrane. One or more components may be located on a bottom side of the device semiconductor layer. At least one of the one or more components may extend along the bottom side of the device semiconductor layer, along the sidewall, and along the bottom side of the membrane. That is, they may begin on the bottom side of the device semiconductor layer and extend along the sidewall and into the well. One or more contact areas may be located on the one or more components on the bottom side of the device semiconductor layer. A support semiconductor layer may form a support frame and may be located below the device semiconductor layer. The support semiconductor layer may include one or more vias or openings through the support semiconductor layer and aligned with the one or more contact areas. The vias or openings may be metalized such that contacts that connect to the one or more components are available at a bottom of the support semiconductor layer. In various embodiments of the present invention, the device and support semiconductor layers may be formed of silicon, gallium arsenide, or other material. The one or more components may be implanted or diffused piezoresistors, field-effect transistors, or other components.

Another illustrative embodiment of the present invention may provide a pressure sensor having a thin membrane, piezoresistors forming a pressure-sensitive device on the underside of this membrane, a supporting frame around and beneath the membrane, and metallization extending from the side of the support frame opposite the membrane to the piezoresistive silicon.

Another illustrative embodiment of the present invention may provide a pressure sensor that may be formed by etching a well in a top side of a device wafer, where the device wafer includes a first buried-oxide layer. A plurality of components may be formed in the top side of the device wafer. A top side of a handle wafer may be fusion bonded to the top side of the device wafer, where the handle wafer includes a second buried-oxide layer. The handle wafer may be etched or ground until the second buried-oxide layer is reached. A plurality of windows or vias may be etched in the handle wafer to expose contact areas on the plurality of components. When the handle wafer has been etched or ground to the second buried-oxide layer, a slow and expensive step, such as a deep reactive ion etch, may not be needed, as it might be for a thicker wafer. Instead, a simple isotropic plasma etch, wet etch, or other appropriate process may be used to form the windows or vias. Metal contacts may be formed through the plurality of windows to the exposed contact areas on the plurality of components. The metal contacts may be formed of aluminum, tantalum, tantalum nitride, titanium, tungsten, gold, platinum or solder, among other metals, or various combinations of these materials. The device wafer may be etched or ground until the first buried-oxide layer is reached.

Another illustrative embodiment of the present invention may provide a pressure sensor that may be formed by implanting piezoresistors on a bottom of a well etched into a first wafer. A second wafer may be fusion bonded to first wafer. The second wafer may be thinned, for example to a thickness less than 50 um. One or more vias may be etched in the thinned wafer, stopping at the implant in the frame of the first wafer. The one or more vias may be filled with a solderable metal stack, and a bondpad may be formed on the bottom of the second wafer of the same metallization. The first wafer may be thinned to create a thin membrane in the sections previously defined as wells. The metallization may be soldered to a flex circuit, printed circuit board, or other appropriate substrate, in order to bring signals and power in and out of the sensor. The soldering step may be self-aligning and may thus reduce the complexity of the assembly process. This assembly may then be mounted into a medical device such as a catheter or guidewire, though the assembly may be incorporated into other types of devices.

In various embodiments of the present invention, these pressure sensors may be located on various types of substrates. For example, pressure sensors according to embodiments of the present invention may be placed on flexible cabling. In other embodiments of the present invention, pressure sensors may be placed as surface mount devices on a printed circuit board or other appropriate substrate.

For example, the metallization on the pressure sensor can be bonded to a flexible sheet or flexible (or flex) circuit. The flex circuit may include other circuitry or components. This flexible circuit may be incorporated into a guidewire designed for medical or veterinary use, or it may be employed for use in other applications.

In various embodiments of the present invention, electrical connections between pressure sensors and a substrate, such as flexible cabling, may be formed in various ways. For example, a pressure sensor may be compression bonded to flexible cabling, printed circuit boards, or other appropriate substrates. By using compression bonding, stress and distortion that may be caused by wire bond leads, may be avoided. In other embodiments of the present invention, the pressure sensor may include through-hole or surface mount leads that may be soldered to through-holes or surface contacts on a printed circuit board, flexible cabling, or other appropriate substrate. In various applications, a cover may be used to protect the pressure sensor.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
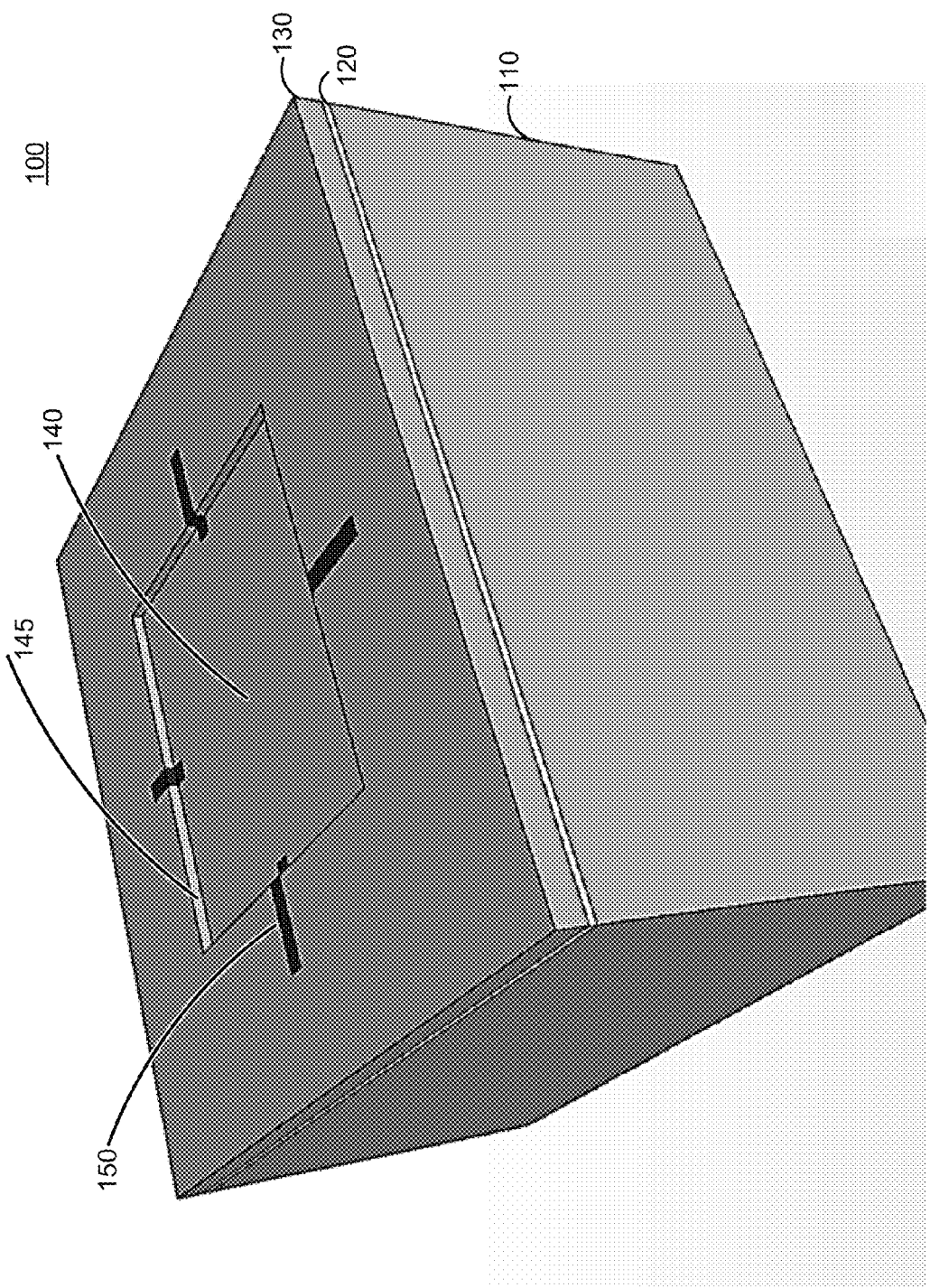
FIGS. 1-7 illustrates portions of a pressure sensor during manufacturing according to an embodiment of the present invention.

Again, exemplary embodiments of the present invention may provide pressure sensors having a membrane having a top surface that may be free of components for electrical connections. Instead of being on a top surface, these components and electrical connections may be located under the membrane. By providing a top surface free of components and electrical connections, a top surface of the pressure sensor may be placed in harsh or corrosive environments, while the components and electrical connections may remain protected under the membrane.

These pressure sensors may be manufactured in various ways consistent with embodiments of the present invention. One such method is outlined in the following figures.

FIGS. 1-7 illustrates portions of a pressure sensor during manufacturing according to an embodiment of the present invention. These figures, as with the other included figures, are shown for illustrative purposes and do not limit either the possible embodiments of the present invention or the claims.

The manufacturing of pressure sensor 100 may begin with device wafer 110. Oxide layer 120 may be grown on device wafer 110. An epitaxial layer 130 may be grown on top of oxide layer 120 such that oxide layer 120 is a buried-oxide layer. Well 140 may be etched in a surface of epitaxial layer 130. Well 140 may be defined by a sidewall 145. One or more components, in this example, implant resistors 150, may be formed in epitaxial layer 130. In this example, implant resistors 150 may be located on a top surface of epitaxial layer 130, and they may extend along sidewall 145 into well 140. An oxide layer (not shown, but referred to as oxide layer 160 below) may cover the surface of epitaxial layer 130.

In various embodiments of the present invention, device wafer 110 and epitaxial layer 130 may be silicon, germanium, gallium arsenide, or other semiconductor material. Well 140 may be etched using potassium hydroxide (KOH). While implant resistors 150 are shown in this example, other components, such as base resistors, capacitors, field effect transistors, or other types of active or passive components may be employed consistent with embodiments of the present invention. These implant resistors 150, or other components, may form pressure sensing circuits, such as Wheatstone bridges, or other structures.

Figure 2:
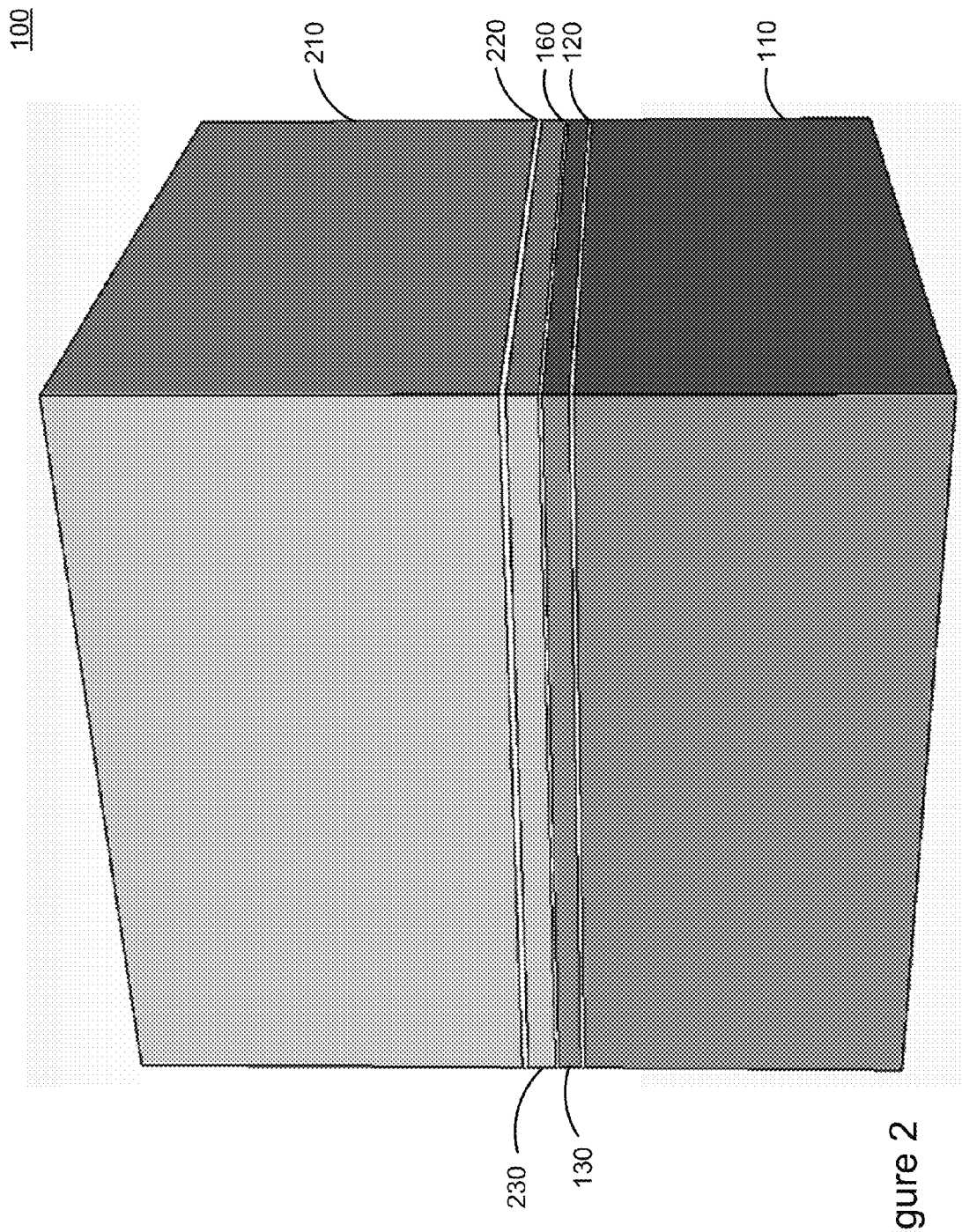

In FIG. 2, a support, handle, or carrier wafer has been attached to a top surface of the device wafer shown in FIG. 1. This handle or support wafer may be formed starting with a wafer 210. An oxide layer 220 may be grown on a top surface of wafer 210. An epitaxial layer 230 may be grown on top of oxide layer 220, such that oxide layer 220 is a buried-oxide layer. The top surfaces of the wafers may then be fusion bonded or otherwise fixed to each other. Oxide layer 160 may be located between epitaxial layers 130 and 230.

In various embodiments of the present invention, handle or support wafer 210 and epitaxial layer 230 may be silicon, germanium, gallium arsenide, or other semiconductor material.

Figure 3:
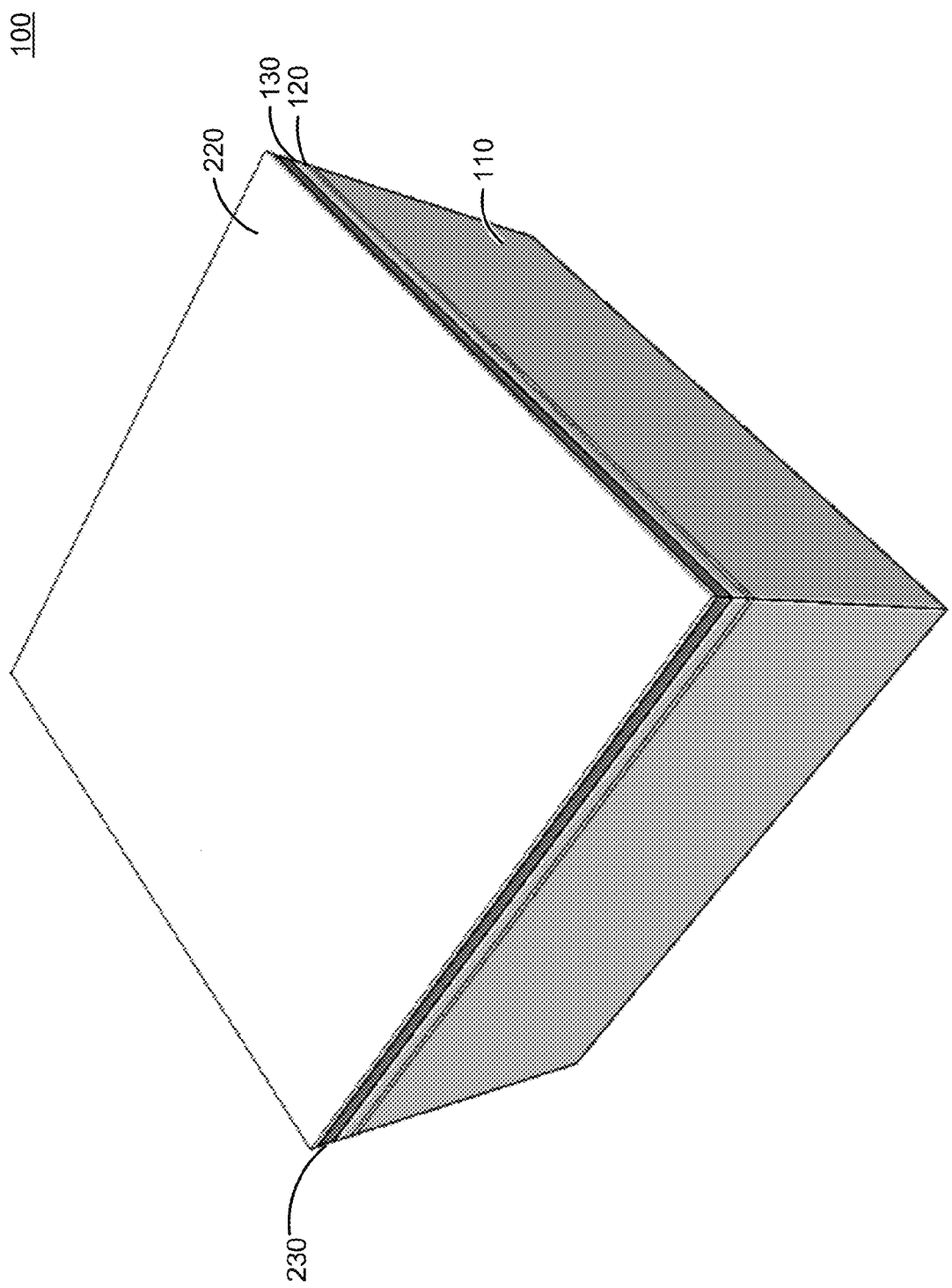

In FIG. 3, handle or support wafer 210 has been removed such that buried-oxide layer 220 is exposed. Handle or support wafer 210 may be removed by etching. Handle or support wafer 210 may also be removed by grinding, or by using other chemical, mechanical, or micromechanical procedures.

Figure 4:
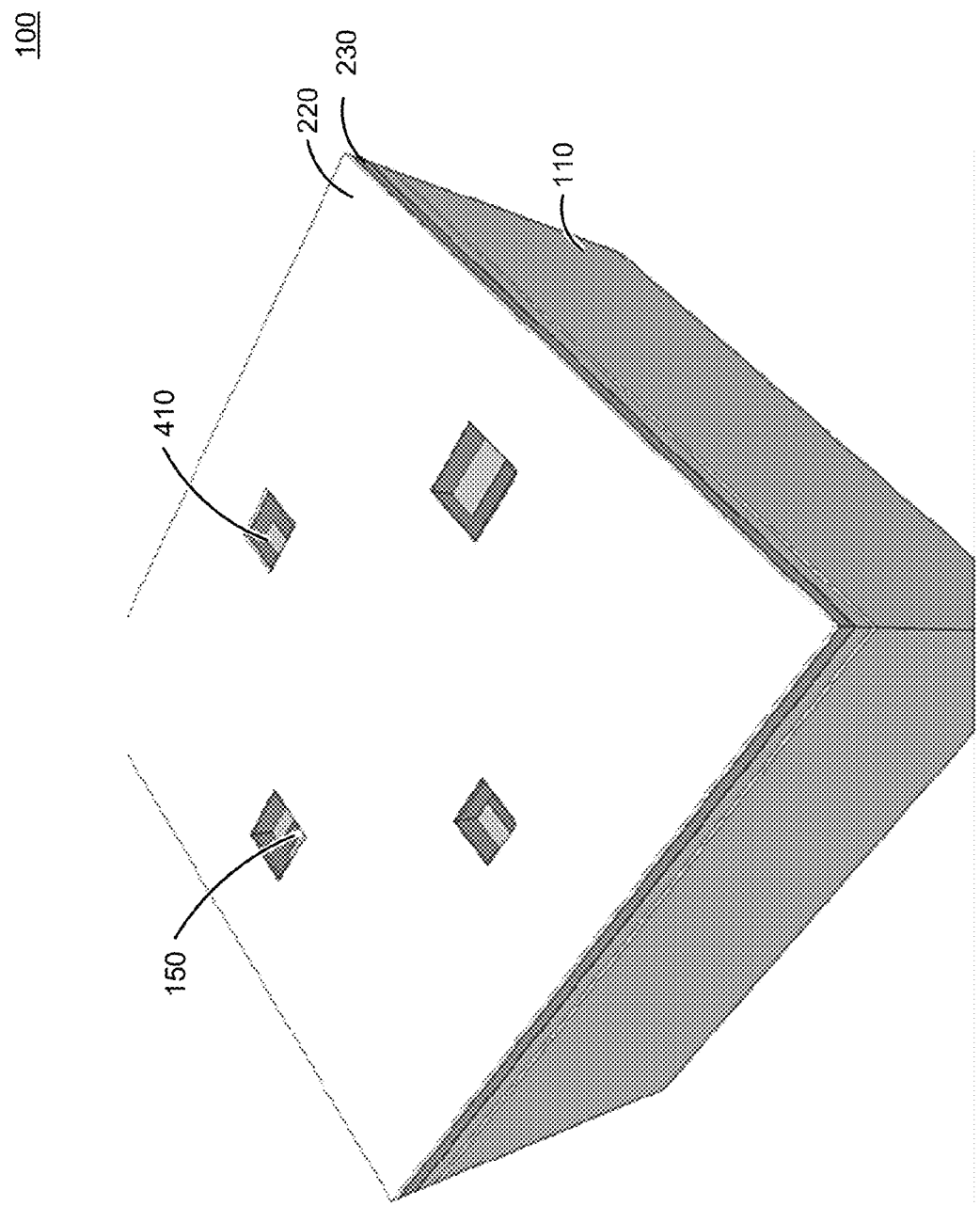

In FIG. 4, contact windows or vias 410 are etched into the newly exposed buried-oxide layer 220 and epitaxial layer 230. These windows or vias 410 may be aligned with one or more contact areas of components 150. These windows or vias 410 may be etched using an isotropic plasma etch, wet etch, or other etch, which may use KOH, or other chemical. Windows or vias 410 may be formed using other mechanical or electromechanical procedures. Since the handle wafer 210 has been thinned, slow and expensive procedures, such as deep reactive ion etching, may not be needed, as they might be for a thicker handle wafer.

More specifically, since handle wafer 210 has been thinned to the buried-oxide layer 220, more options exist as to how to for contact windows or vias 410. For example, a more expensive deep reactive ion etch is not necessary. Again, an isotropic plasma etch, wet etch, or other etch may be used instead. Also, in the event a deep reactive ion etch is used, it will not take as long since handle wafer 210 has been thinned. Moreover, this may eliminate the need for a special deep reactive ion etch tool or etcher. Accordingly, thinning handle wafer 210 may allow the use of lower-cost manufacturing etching procedures.

Figure 5:
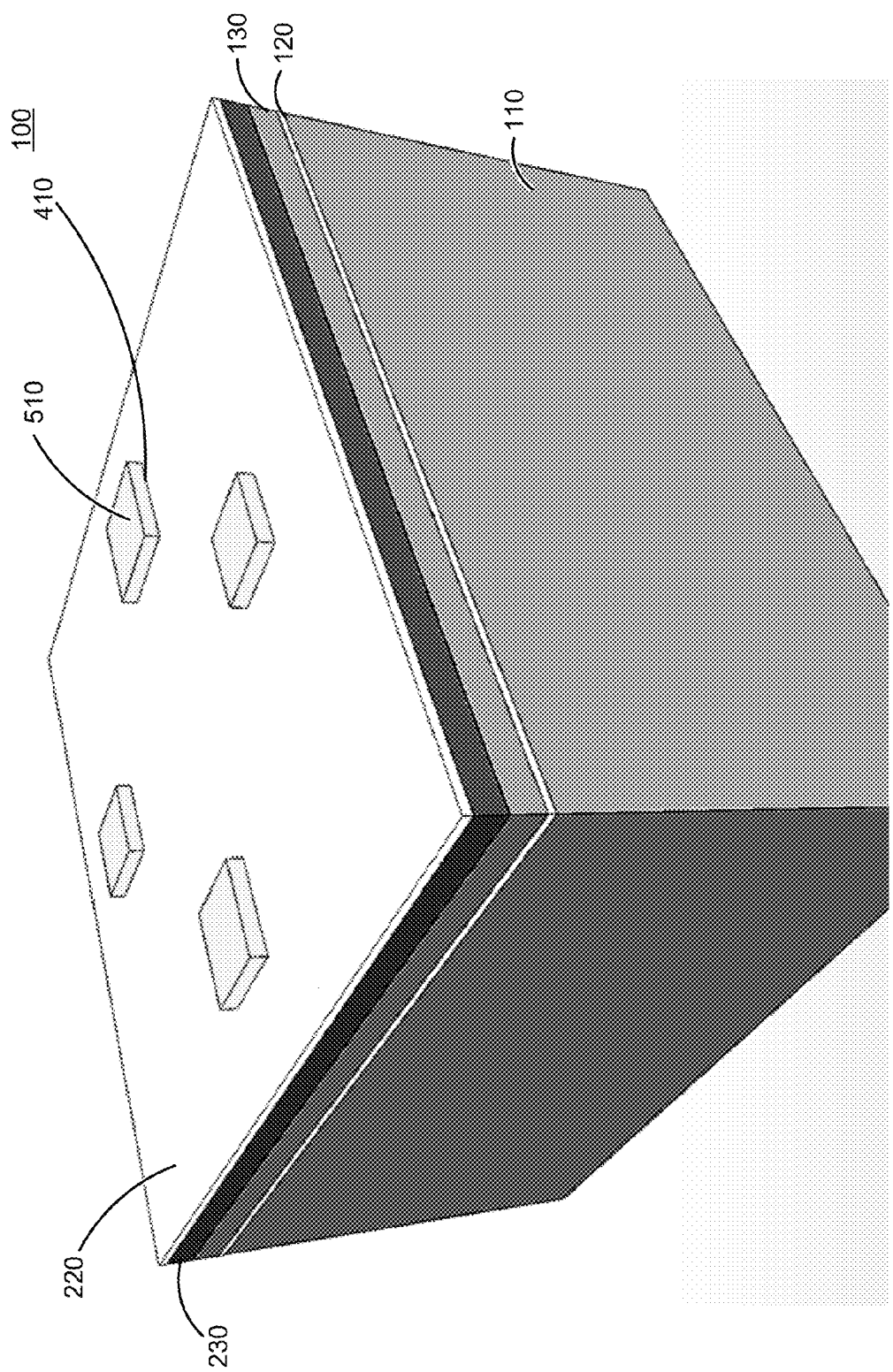

In FIG. 5, openings or vias 410 may be metallized to form contacts 510. Contacts 510 may be formed of aluminum, tantalum, tantalum nitride, titanium, tungsten, gold, platinum or solder, among other metals, or various combinations of these materials.

Figure 6:
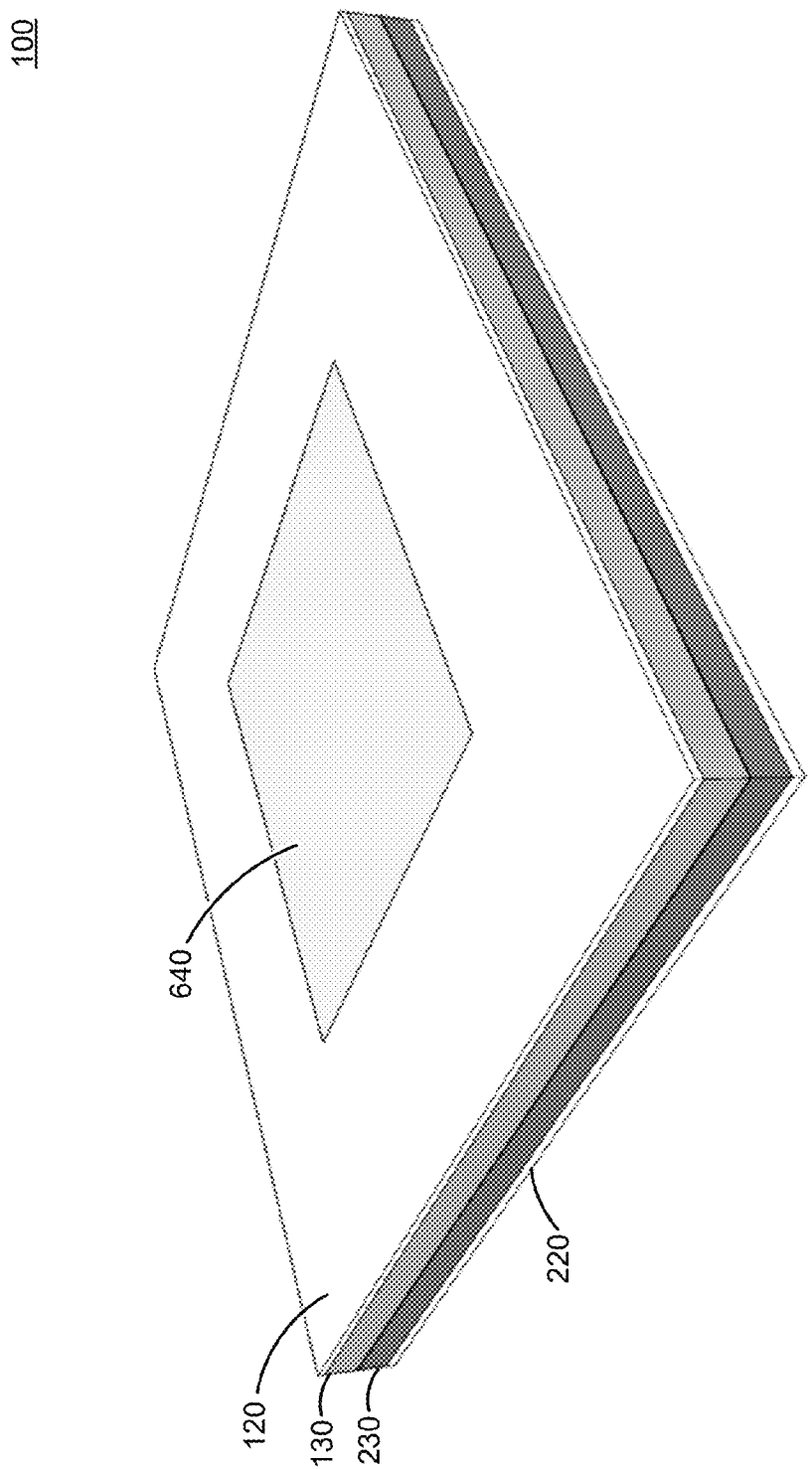

In FIG. 6, device wafer 110 has been removed to expose buried-oxide layer 120. Accordingly, membrane 640, which is defined by well 140 in FIG. 1, is available at a top side of pressure sensor 100.

Figure 7:
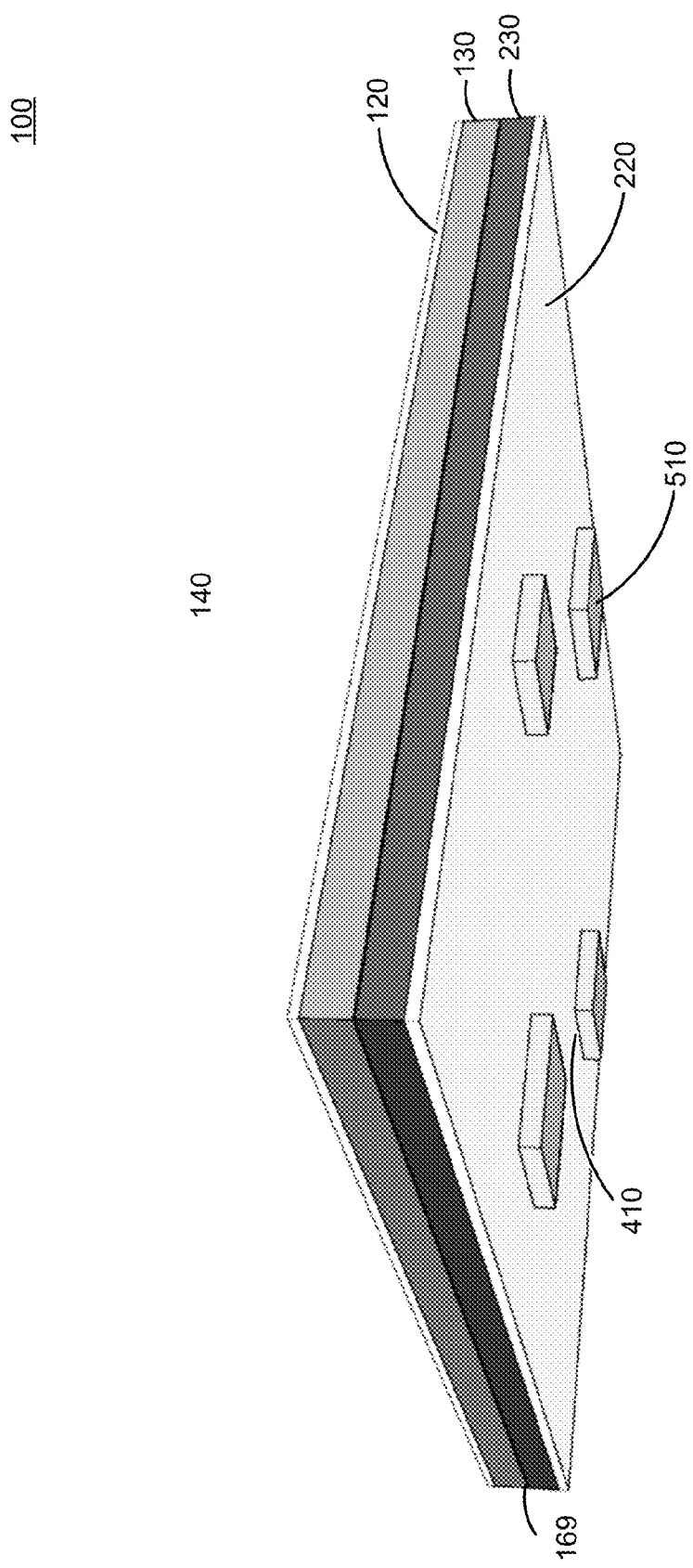

FIG. 7 illustrates a bottom view of a completed pressure sensor 100 according to embodiments of the present invention. Again, a top side may be covered with buried-oxide layer 120. Epitaxial layers 130 and 230 may be separated by oxide layer 160. A bottom side or surface of pressure sensor 100 may be covered with a second oxide layer 220. Metallized contacts 510 may be available on a bottom surface of pressure sensor 100.

Again, membrane 640 may be defined by well 140. This is shown further in the following figures.

Figure 8:
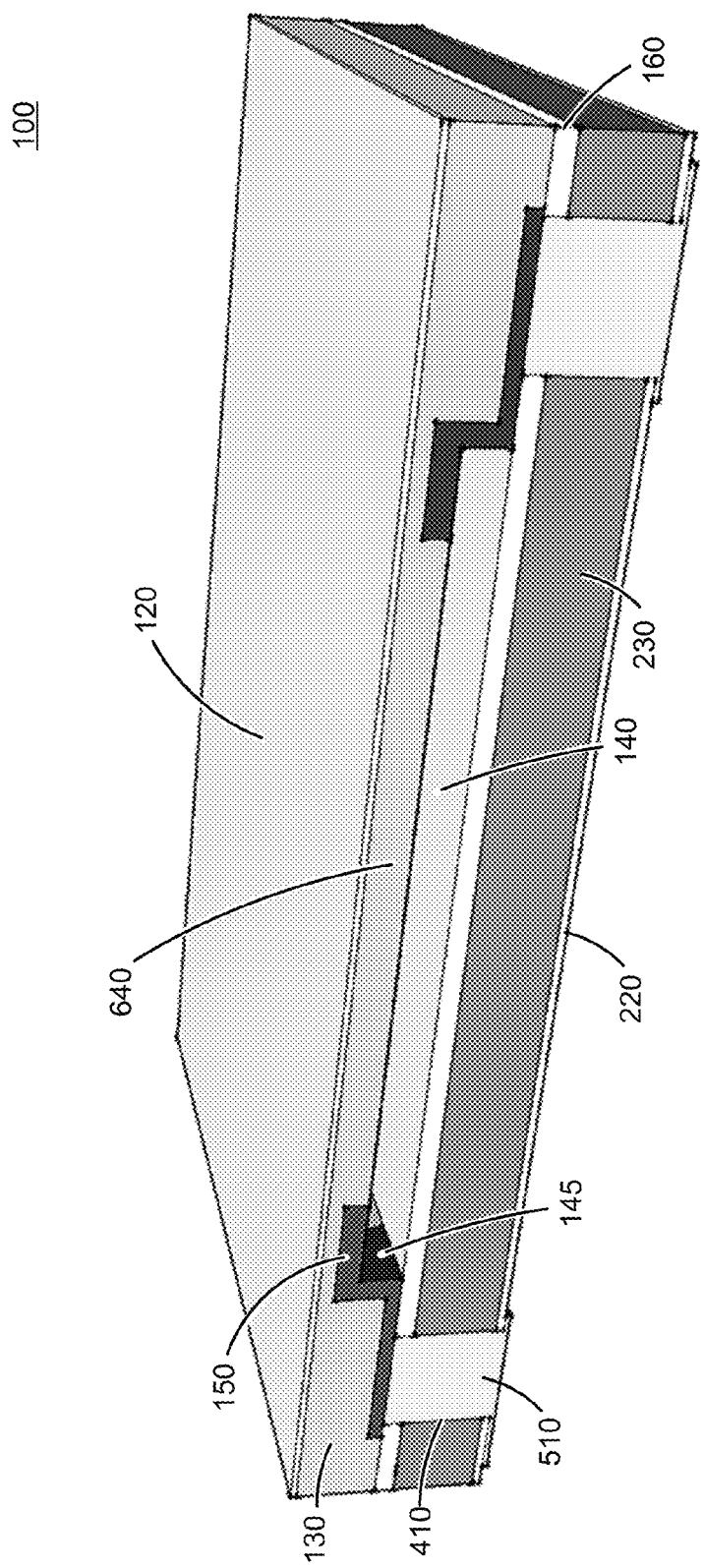
FIG. 8 illustrates a first oblique cutaway view of a pressure sensor according to an embodiment of the present invention.

FIG. 8 illustrates a first oblique cutaway view of a pressure sensor according to an embodiment of the present invention. Again, membrane or diaphragm 640 is defined by well 140 having sidewalls 145. Membrane 640 may be located in semiconductor device layer 130. One or more components, such as implant resistors 150, may be located along an underside of device semiconductor layer 130. In this example, implant resistors may extend along a bottom side of semiconductor device layer 130, along sidewall 145, and along a bottom side of membrane or diaphragm 640. Oxide layer 120 may cover a top side of semiconductor device layer 130.

A handle or support semiconductor device layer 230 may be located under device semiconductor layer 130. Oxide layer 160 may be located between these two layers. Support or handle semiconductor layer 230 may include openings 410. Openings 410 may be metallized to form metal contacts 510. Metalized contacts 510 may be available a bottom side of pressure sensor 100 and they may form electrical connections with contact areas on one or more components 150. A bottom side of handle or support semiconductor layer 230 may be covered by buried-oxide layer 220.

Figure 9:
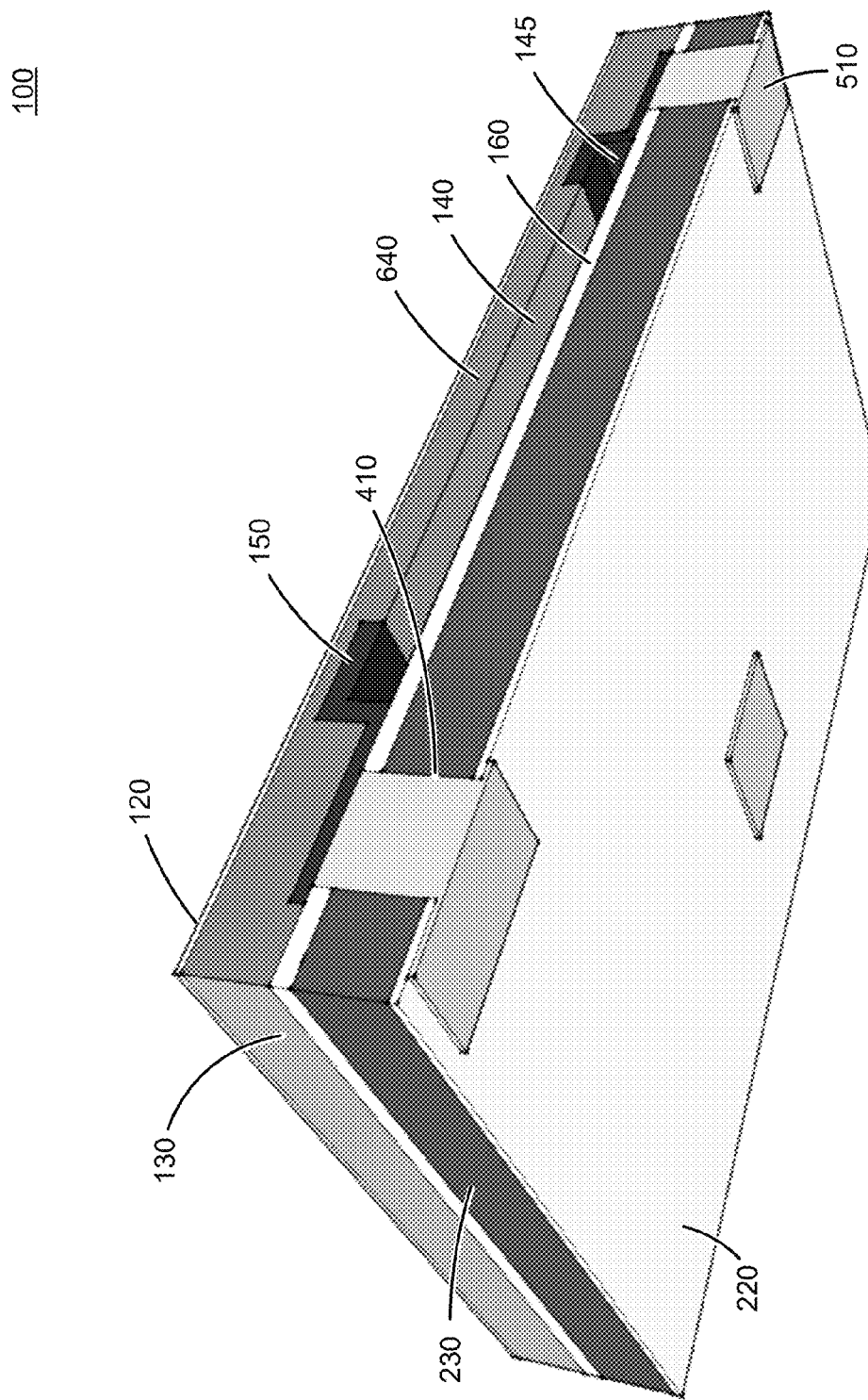
FIG. 9 illustrates a second oblique cutaway view of a pressure sensor according to an embodiment of the present invention.

FIG. 9 illustrates a second oblique cutaway view of a pressure sensor according to an embodiment of the present invention. Contacts 510 may be available on a bottom side of pressure sensor 100. Contacts 510 may pass through openings or vias 410 in support or handle semiconductor layer 230. A bottom side of handle or support semiconductor layer 230 may be covered by buried-oxide layer 220. Oxide layer 160 may be present between support or handle semiconductor layer 230 and device semiconductor layer 130. Well 140 located in device semiconductor layer 130 may form membrane 640. Membrane 640 may include one or more components 150, which may extend along sidewall 145 and under device semiconductor layer 130 to contacts 410. A top side of device semiconductor layer 130 may be covered by buried-oxide layer 120.

During operation of the pressure sensor, pressure forces present at a top surface of membrane 640 may cause membrane 640 to deflect. This deflection may change one or more characteristics of the one or more components, such as implant resistors 150. For example, implant resistors 150 may form a Wheatstone bridge where the values of implant resistors 150 change when membrane 640 is deflected. Terminals of the Wheatstone bridge may be contacted by metal contacts 510, which may make the terminals available at a bottom of pressure sensor 100.

Again, these terminals may be made available for connection to various types of substrates. For example, pressure sensors according to embodiments of the present invention may be placed on flexible cabling. In other embodiments of the present invention, they may be placed as surface mount devices on a printed circuit board or other appropriate substrate.

For example, the metallization on the pressure sensor can be bonded to a flexible sheet or flexible (or flex) circuit. These flex circuits may be formed by etching a copper or other conductive layer that has been placed over a Kapton® or other insulating layer. The flex circuit may include other circuitry or components. This flexible circuit may be incorporated into a guidewire designed for medical or veterinary use, or it may be employed for use in other applications.

In various embodiments of the present invention, electrical connections between pressure sensors and a substrate, such as flexible cabling, may be formed in various ways. For example, a pressure sensor may be compression bonded to flexible cabling, printed circuit boards, or other appropriate substrates. By using compression bonding, stress and distortion that may be caused by wire bond leads, may be avoided. In other embodiments of the present invention, the pressure sensor may include through-hole or surface mount leads that may be soldered to through-holes or surface contacts on a printed circuit board, flexible cabling, or other appropriate substrate.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A pressure sensing device comprising:
   a first silicon layer having a membrane over a well area, the well area defined by a bottom of the membrane and a sidewall;
   a plurality of components formed in the first silicon layer, at least one of the plurality of components extending from a bottom of the first silicon layer, along the side wall, and to the bottom of the membrane;
   a second silicon layer below the first silicon layer, the second silicon layer having a plurality of vias aligned with contact areas on the plurality of components; and
   a plurality of contacts, each extending through one of the plurality of vias and contacting a contact area on one of the plurality of components.

2. The pressure sensing device of claim 1 wherein the plurality of components comprises implant resistors.

3. The pressure sensing device of claim 2 further comprising a first oxide layer between the first silicon layer and the second silicon layer.

4. The pressure sensing device of claim 3 further comprising a second oxide layer on the top side of the first silicon layer.

5. The pressure sensing device of claim 4 further comprising a third oxide layer on the bottom of the second silicon layer.

6. The pressure sensing device of claim 2 further comprising a protective layer over the top of the pressure sensing device.

7. The pressure sensing device of claim 2 wherein the plurality of contacts form electrical connections with a plurality of conductors.

8. The pressure sensing device of claim 7 wherein the plurality of conductors are conductors in a flexible cabling.

9. A pressure sensor comprising:
a first semiconductor layer having a top surface, the top surface having no components or electrical contacts, the top surface forming a top surface of a membrane;
a plurality of components formed in the first semiconductor layer, at least one of the plurality of components extending from a bottom of the first semiconductor layer to the bottom of the membrane; and
a plurality of contacts, each contacting a contact area on one of the plurality of components.

10. The pressure sensor of claim 9 further comprising:
a second semiconductor layer below the first semiconductor layer.

11. The pressure sensor of claim 10 wherein the plurality of contacts each pass through a via in the second semiconductor layer and are accessible at a bottom of the second semiconductor layer.

12. The pressure sensor of claim 9 wherein the first semiconductor layer is a silicon layer.

13. A pressure sensor comprising:
a device wafer having a bottom side including a well, the device wafer including a first oxide layer on a top side of the device wafer;
a plurality of components in the bottom side of the device wafer;
a handle wafer, wherein a top side of the handle wafer is bonded to the bottom side of the device wafer, the handle wafer including a second oxide layer on a bottom side of the handle wafer, the handle wafer having a plurality of windows from the bottom side of the handle wafer to the top side of the handle wafer; and
a plurality of metal contacts, each metal contact in one of the plurality of windows, the plurality of metal contacts to form electrical connections with one or more of the plurality of components.

14. The pressure sensor of claim 13 wherein at least one of the plurality of metal contacts extends through one of the plurality of windows and contacts a contact area on one of the plurality of components.

15. The pressure sensor of claim 13 wherein each of the plurality of metal contacts extends through a corresponding one of the plurality of windows and contacts a contact area on one of the plurality of components.

16. The pressure sensor of claim 13 wherein the device wafer and the handle wafer are bonded using a process selected from the group consisting of fusion bonding or anodically bonding.

17. The pressure sensor of claim 13 wherein the plurality of components comprises implant resistors which may form a Wheatstone bridge or half bridge.

18. The pressure sensor of claim 17 further comprising:
a third oxide layer of the top side of the device wafer.

19. The pressure sensor of claim 17 wherein the device wafer is formed using:
a silicon wafer;
an oxide layer over a top surface of the silicon wafer; and
an epitaxial silicon layer over the oxide layer,
wherein the silicon wafer is removed by etching such that the oxide layer becomes the first oxide layer.

20. The pressure sensor of claim 19 wherein the handle wafer is formed using:
a silicon wafer;
an oxide layer over a top surface of the silicon wafer; and
an epitaxial silicon layer over the oxide layer,
wherein the silicon wafer is removed by etching such that the oxide layer becomes the second oxide layer.

21. The pressure sensor of claim 17 further comprising electrical connections formed between the plurality of contacts and a plurality of conductors.

22. The pressure sensor of claim 21 wherein the plurality of conductors are conductors in a flexible cabling.

23. The pressure sensor of claim 22 wherein the electrical connections between the plurality of contacts and a plurality of conductors are formed by compression bonding.

* * * * *